(12) United States Patent
Yamada et al.

(10) Patent No.: US 7,795,892 B2
(45) Date of Patent: Sep. 14, 2010

(54) PROBE CARD

(75) Inventors: Yoshio Yamada, Nagano (JP); Hiroshi Nakayama, Nagano (JP); Mitsuhiro Nagaya, Nagano (JP); Shogo Imuta, Nagano (JP)

(73) Assignee: NHK Spring Co., Ltd., Kanagawa (JP)

( * ) Notice: Subject to any disclaimer, the term of this patent is extended or adjusted under 35 U.S.C. 154(b) by 76 days.

(21) Appl. No.: 12/087,244

(22) PCT Filed: Dec. 20, 2006

(86) PCT No.: PCT/JP2006/325431
§ 371 (c)(1),
(2), (4) Date: Dec. 15, 2008

(87) PCT Pub. No.: WO2007/077743
PCT Pub. Date: Jul. 12, 2007

(65) Prior Publication Data
US 2009/0167335 A1    Jul. 2, 2009

(30) Foreign Application Priority Data
Dec. 28, 2005 (JP) ............................. 2005-380380

(51) Int. Cl.
*G01R 31/02* (2006.01)
(52) U.S. Cl. ..................... 324/758; 324/754; 324/761
(58) Field of Classification Search ............... 324/73.1, 324/158.1, 750–758, 760–765; 439/66, 91, 439/877, 358, 752, 352, 350; 216/13
See application file for complete search history.

(56) References Cited

U.S. PATENT DOCUMENTS 7,071,715 B2    7/2006    Shinde et al.

(Continued)

FOREIGN PATENT DOCUMENTS

JP    62-94635    6/1987

(Continued)

OTHER PUBLICATIONS

International Search Report issued Mar. 27, 2007 in PCT/JP2006/325431.

(Continued)

*Primary Examiner*—Minh N Tang
*Assistant Examiner*—Trung Q Nguyen
(74) *Attorney, Agent, or Firm*—Edwards Angell Palmer & Dodge LLP

(57) ABSTRACT

Provided is a probe card capable of surely bringing probes into contact with a contact object regardless of a temperature environment of a test. To achieve the object, the probe card includes a plurality of probes that are made of a conductive material and come into contact with electrode pads of a semiconductor wafer to input or output an electric signal; a probe head that houses and holds the probes; a substrate that has a wiring pattern corresponding to the circuitry; and a space transformer that is stacked on the probe head, changes a space of the wiring pattern of the substrate and thus relays wires, and has electrode pads provided on a surface on a side opposed to the probe head in association with the relayed wires. Both ends of the probes come into contact with portions near the centers of the electrodes pads of the semiconductor wafer and the space transformer under an environment having an average temperature of a lowest temperature and a highest temperature in testing the semiconductor wafer.

9 Claims, 12 Drawing Sheets

U.S. PATENT DOCUMENTS 7,458,818 B2 * 12/2008 Kiyofuji et al. ............... 439/66
7,501,839 B2 * 3/2009 Chan et al. .................. 324/754
2006/0244470 A1 11/2006 Shinde et al.

FOREIGN PATENT DOCUMENTS

| JP | 63-293845 | 11/1988 |
| JP | 07-270816 | 10/1995 |
| JP | 2000-241454 | 9/2000 |
| JP | 2001-007167 | 1/2001 |
| JP | 2001-007168 | 1/2001 |
| JP | 2003-240801 | 8/2003 |
| JP | 2004-119945 | 4/2004 |
| JP | 2005-337737 | 12/2005 |
| WO | WO-2005069914 A2 | 8/2005 |
| WO | WO-2005/114228 | 12/2005 |

OTHER PUBLICATIONS

Office Action mailed on May 18, 2008 in the corresponding Korean patent application.

* cited by examiner

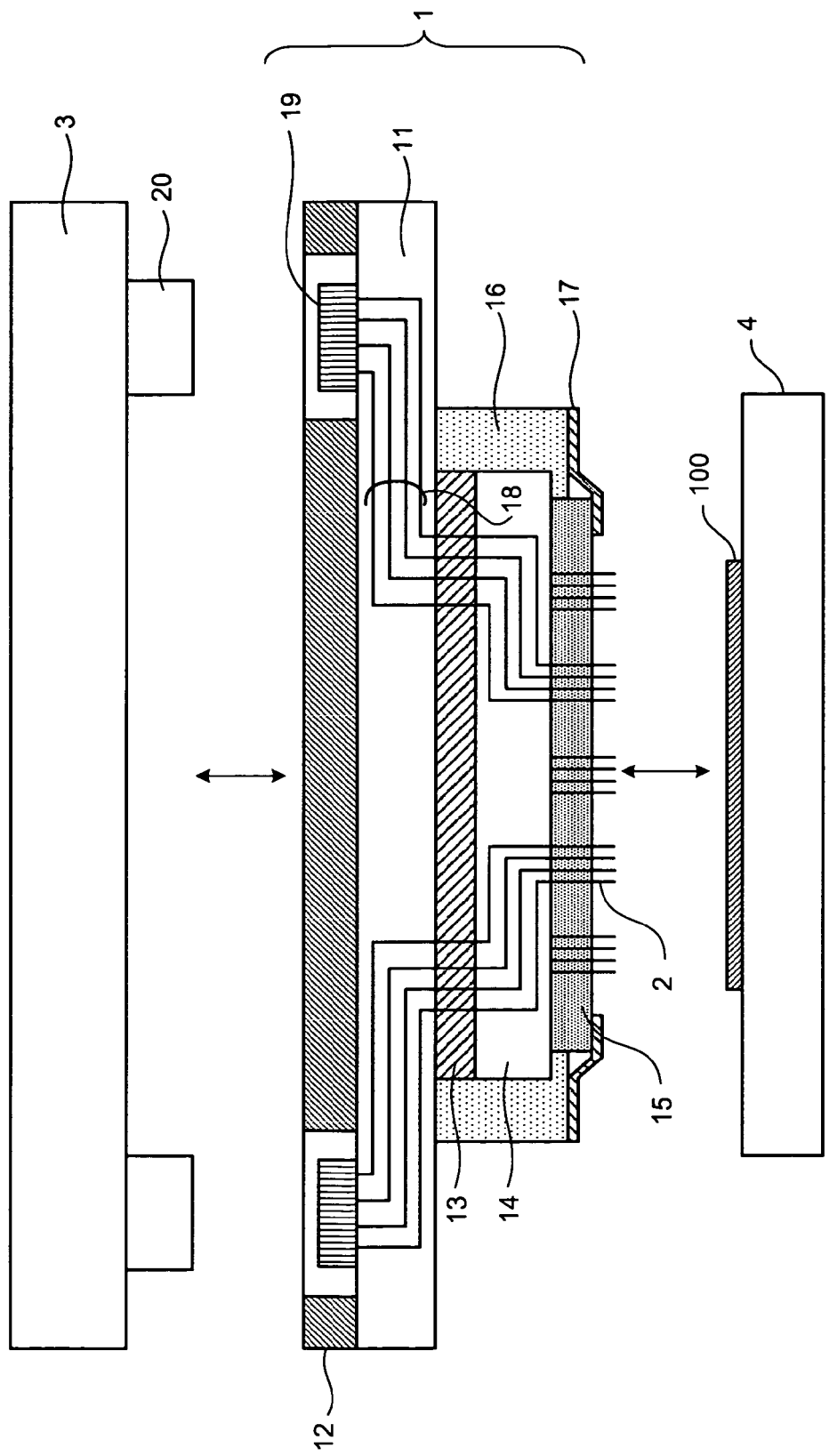

PROBE CARD

TECHNICAL FIELD

The present invention relates to a probe card that electrically connects a semiconductor wafer as a test object and a circuit structure for generating a signal for a test.

BACKGROUND ART

In a semiconductor test process, a conductivity test is sometimes performed to detect a defective product by bringing probes having conductivity (conductive probes) into contact with a semiconductor wafer before dicing (WLT: Wafer Level Test). When this WLT is performed, to transfer a signal for a test generated and sent by a testing device (tester) to the semiconductor wafer, a probe card including a large number of probes is used. In the WLT, the probes are individually brought into contact with each of dies on the semiconductor wafer while the dies are scanned by the probe card. However, because several hundreds to several ten thousands dies are formed on the semiconductor wafer, it takes considerable time to test one semiconductor wafer. Thus, an increase in the number of dies causes higher cost.

To solve the problems of the WLT, recently, a method called FWLT (Full Waver Level Test) is also used in which several hundreds to several ten thousands probes are collectively brought into contact with all or at least a quarter to a half of dies on a semiconductor wafer. To accurately bring the probes into contact with the semiconductor wafer, this method requires technologies for maintaining positional accuracy of tips of probes by accurately keeping the parallelism or the flatness of a probe card with respect to a predetermined reference surface and for highly accurately aligning a semiconductor wafer.

FIG. 17 is a schematic diagram of the structure of a main part of a probe card applied in the FWLT. A probe card 41 shown in the figure includes a plurality of probes 42 arranged in association with electrode pads 101 provided in a semiconductor wafer 100, a probe head 43 that houses the probes 42, and a space transformer 44 as a relay substrate that transforms a space of a fine wiring pattern in the probe head 43 and relays wires. In the space transformer 44, electrode pads 45 are provided in positions corresponding to the probes 42 housed in the probe head 43. Tips of the probes 42 are in contact with the electrode pads 45. Wires (not shown) having a pattern corresponding to the electrode pads 45 are provided in the space transformer 44. The wires are connected to a substrate for a test via an interposer (the interposer and the substrate are not shown).

Patent Document 1: Japanese Patent Application Laid-open No. 2003-240801

DISCLOSURE OF INVENTION

Problem to be Solved by the Invention

A test of the semiconductor wafer 100 is performed under a plurality of different temperature environments. Therefore, a difference among values of coefficients of thermal expansion (CTEs) of the probe head 43, the space transformer 44, and the semiconductor wafer 100 poses a problem in the probe card 41.

This point is specifically explained below. In the following explanation, it is assumed that a state shown in FIG. 17 is a state under a room temperature environment (about 25° C.) It is also assumed that, when the coefficient of thermal expansion of the probe head 43 is represented as $C_P$, the coefficient of thermal expansion of the space transformer 44 is represented as $C_S$, and the coefficient of thermal expansion of the semiconductor wafer 100 is represented as $C_W$, a relation $C_S < C_P < C_W$ holds among the three coefficients of thermal expansion. In this case, under a high temperature environment (e.g., about 85° C.), as shown in FIG. 18, degrees of thermal expansion of the probe head 43, the space transformer 44, and the semiconductor wafer 100 are different. Therefore, a positional relation among the probe head 43, the space transformer 44, and the semiconductor wafer 100 changes from that under the room temperature and the probes 42 may not come into contact with the electrode pads 101 of the semiconductor wafer 100 and the electrode pads 45 of the space transformer 44.

As described above, because a probe card is configured by stacking a plurality of materials having coefficients of thermal expansion different from one another, it is inevitable that degrees of expansion of the respective materials are different depending on a temperature environment during a test. Therefore, in order to improve such a situation, there is a demand for a technology that can surely bring probes into contact with a contact object regardless of a temperature environment during a test.

The present invention has been devised in view of the above and it is an object of the present invention to provide a probe card that can surely bring probes into contact with a contact object regardless of a temperature environment during a test.

Means for Solving Problem

A probe card according to an aspect of the present invention electrically connects a semiconductor wafer to be tested and a circuitry for generating a signal for a test. The probe card includes a plurality of probes that are made of a conductive material and come into contact with electrode pads of a semiconductor wafer to input or output an electric signal; a probe head that houses and holds the probes; a substrate that has a wiring pattern corresponding to the circuitry; and a space transformer that is stacked on the probe head, changes a space of the wiring pattern of the substrate and thus relays wires, and has electrode pads provided on a surface on a side opposed to the probe head in association with the relayed wires. Both ends of the probes come into contact with portions near the centers of the electrodes pads of the semiconductor wafer and the space transformer under an environment having an average temperature of a lowest temperature and a highest temperature in testing the semiconductor wafer.

The probe card may further include a plurality of positioning pins that are fastened to the space transformer and perform positioning of the space transformer and the probe head. The probe head may have a plurality of positioning holes, through which the positioning pins are inserted, and at least one of the positioning holes is formed in a long hole shape, length in a longitudinal direction of which is larger than a diameter of the positioning pins.

A probe card according to another aspect of the present invention electrically connects a semiconductor wafer to be tested and a circuitry for generating a signal for a test. The probe card includes a plurality of probes that are made of a conductive material and come into contact with electrode pads of a semiconductor wafer to input or output an electric signal; a probe head that houses and holds the probes; a substrate that has a wiring pattern corresponding to the circuitry; a space transformer that is stacked on the probe head, changes a space of the wiring pattern of the substrate and relays wires, and has electrode pads provided on a surface on a side opposed to the probe head in association with the relayed wires; and a plurality of positioning pins that are fastened to the space transformer and perform positioning of the space transformer and the probe head. The probe head has a plurality of positioning holes, through which the positioning pins are inserted, respectively, and at least one of the positioning holes is formed in a long hole shape, length in a longitudinal direction of which is larger than a diameter of the positioning pins.

In the probe card, a surface of the probe head may be formed in a center-symmetrical shape, a pair of positioning pins may be inserted near both ends of a diagonal line that passes a center of the surface, and length in a direction parallel to the diagonal line of a positioning hole, through which one of the pair of positioning pins is inserted, may be larger than the diameter of the positioning pins.

In the probe card, a surface of the probe head may be formed in a center-symmetrical shape, a plurality of positioning pins may be inserted in positions symmetrical with respect to a center of the surface, and length in a radial direction radially widening from the center of the surface of positioning holes, through which the respective positioning pins are inserted, may be larger than the diameter of the positioning pins.

The probe card may further include a reinforcing member that is mounted on the substrate and reinforces the substrate; an interposer that is made of a conductive material and interposed between the substrate and the space transformer to relay wires of the substrate; a holding member that is fastened to the substrate and applies a pressure to and holds the interposer and the space transformer; and a leaf spring that is fastened to the holding member and presses an entire circumference near an edge of a surface of the probe head, which is a surface on which the probes project, in a direction of the substrate.

Effect of the Invention

The probe card according to the present invention includes a plurality of probes that are made of a conductive material and come into contact with electrode pads of a semiconductor wafer to input or output an electric signal; a probe head that houses and holds the probes; a substrate that has a wiring pattern corresponding to the circuitry; and a space transformer that is stacked on the probe head, changes a space of the wiring pattern of the substrate and thus relays wires, and has electrode pads provided on a surface on a side opposed to the probe head in association with the relayed wires. Both ends of the probes come into contact with portions near the centers of the electrodes pads of the semiconductor wafer and the space transformer under an environment having an average temperature of a lowest temperature and a highest temperature in testing the semiconductor wafer. Accordingly, it is possible to surely bring the probes into contact with a contact object regardless of a temperature environment during a test.

The probe card according to the present invention includes a plurality of positioning pins that are fastened to the space transformer and perform positioning of the space transformer and the probe head, wherein the probe head has a plurality of positioning holes, through which the positioning pins are inserted, and at least one of the positioning holes is formed in a long hole shape, length in a longitudinal direction of which is larger than a diameter of the positioning pins. Accordingly, it is possible to surely bring the probes into contact with a contact object regardless of a temperature environment during a test. It is also possible to prevent breakage and the like of the probe card due to thermal expansion.

BRIEF DESCRIPTION OF DRAWINGS

FIG. 3 is a diagram of an overview of a test performed by using the probe card according to the first embodiment of the present invention.

Figure 1:
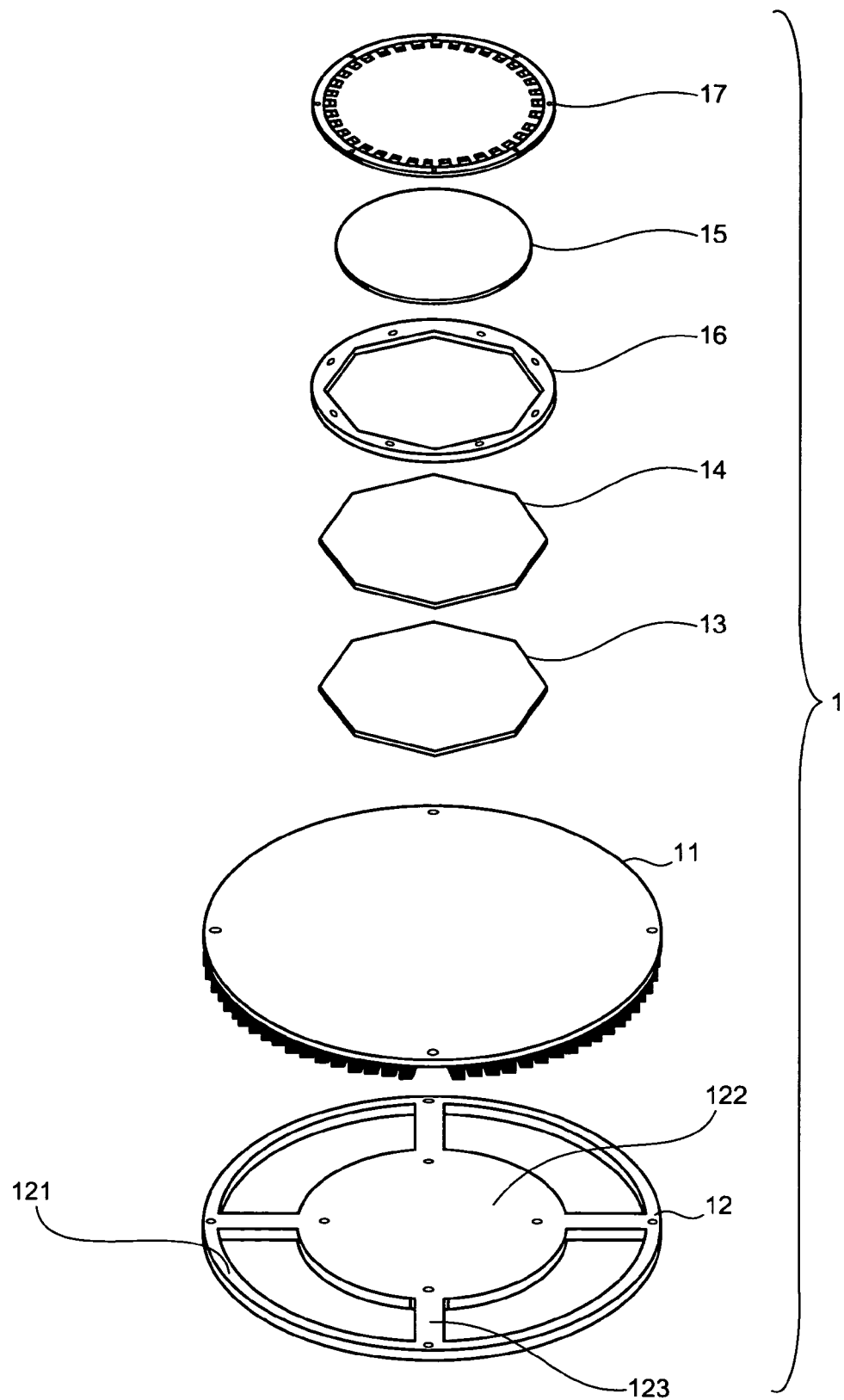
FIG. 1 is a exploded perspective view of the structure of a probe card according to a first embodiment of the present invention.

EXPLANATIONS OF LETTERS OR NUMERALS 1, 21, 31, 41 Probe card
2, 42 Probe
3 Connector seat
4 Wafer chuck
11 Substrate
12 Reinforcing member
13 Interposer
14, 14-2, 22, 25, 32, 44 Space transformer 15, 15-2, 23, 26, 33, 43 Probe head
15p Probe housing area
16 Holding member
17 Leaf spring
18 Wire
19 Male connectors
20 Female connectors
24a, 24b, 27a, 27b, 34a, 34b, 34c, 34d Positioning pin
45, 101, 141 Electrode pad
100 Semiconductor wafer
121 Outer peripheral section
122 Center section
123 Coupling section
171 Pawl section
231, 232, 261, 331, 332, 333, 334 Positioning hole

BEST MODE(S) FOR CARRYING OUT THE INVENTION

Best modes for carrying out the present invention (hereinafter, "embodiments") are explained below with reference to the accompanying drawings. It should be noted that the drawings are schematic and a relation between the thickness and width of each portion, a ratio of the thicknesses of the respective portions and the like are different from realistic ones. It goes without saying that, the drawings depict some portion as having different relations and ratios of dimensions.

First Embodiment

Figure 2:
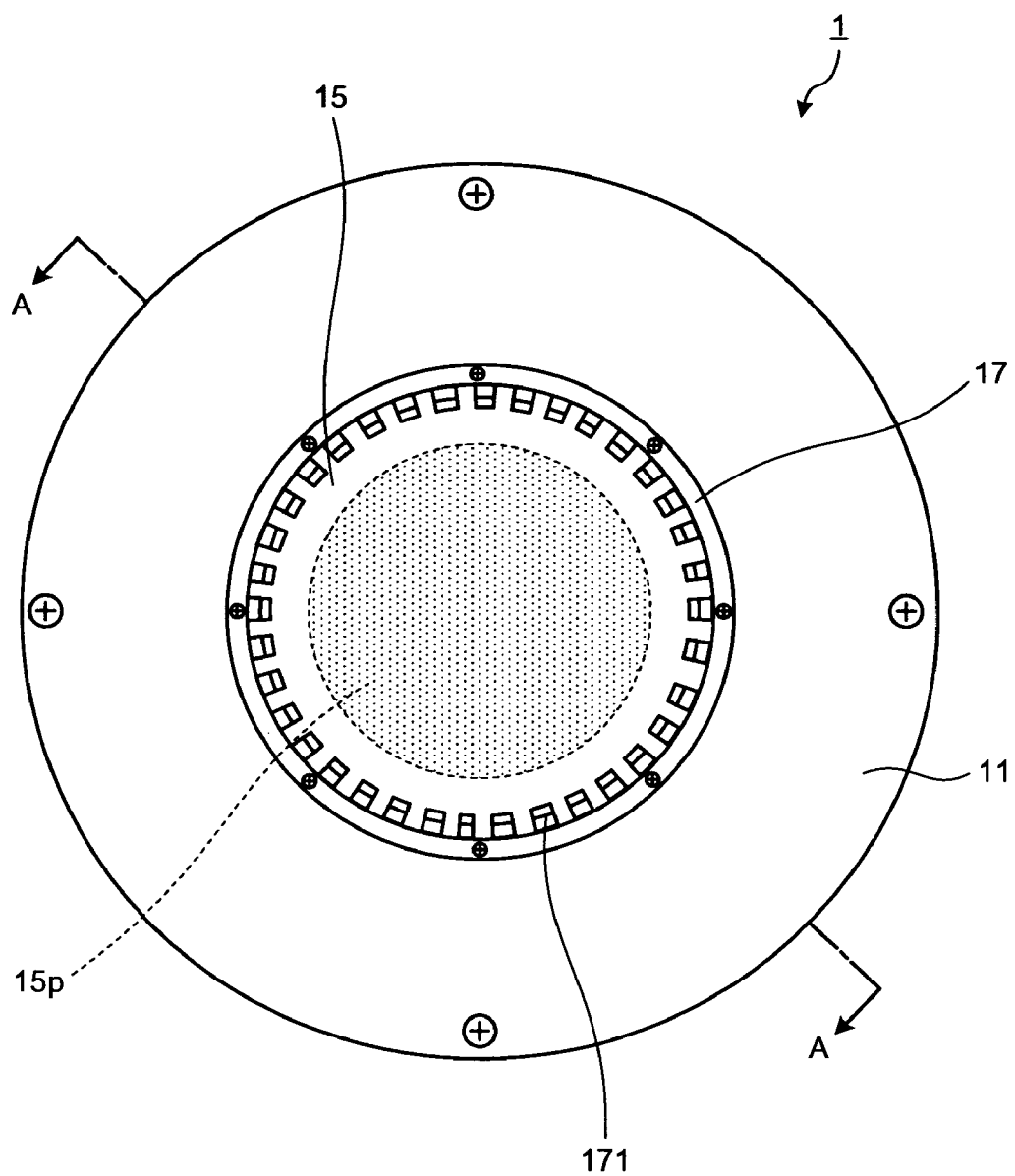
FIG. 2 is a top view of the structure of the probe card according to the first embodiment of the present invention.

FIG. 1 is an exploded perspective view of the structure of relevant part of a probe card according to a first embodiment of the present invention. FIG. 2 is a top view of the probe card according to the first embodiment. FIG. 3 is a diagram of an overview of a test performed by using a probe card of the first embodiment and is a schematic sectional view taken along line A-A in FIG. 2 of the probe card. The probe card 1 shown in FIGS. 1 to 3 electrically connects, using a plurality of probes, a semiconductor wafer 100 as a test object and a testing device including a circuit structure for generating a signal for a test.

The probe card 1 includes a substrate 11 that is formed in a thin disc shape and realizes electrical connection with the testing device, a reinforcing member 12 that is mounted on one side of the substrate 11 and reinforces the substrate 11, an interposer 13 for connection of wires from the substrate 11, a space transformer 14 (relay substrate) that transforms and thus relays intervals among the wires connected through the interposer 13, and a probe head 15 that is formed in a disc shape having a diameter smaller than that of the substrate 11 and stacked on the space transformer 14 and houses and holds a plurality of probes 2 according to a wiring pattern of the test object. The probe card 1 also includes a holding member 16 that is fixed to the substrate 11 and collectively holds the interposer 13 and the space transformer 14 in a stacked state and a leaf spring 17 that is fixed to the holding member 16 and fixes an end of the probe head 15.

The more detailed structure of the probe card 1 is explained below. The substrate 11 is formed by using an insulating material such as polyimide, Bakelite or epoxy resin. In the substrate 11, a wiring layer (wiring pattern) for electrically connecting the probes 2 and the testing device is three-dimensionally formed by via-holes and the like.

The reinforcing member 12 includes a circular outer peripheral portion 121 that has substantially the same diameter as the substrate 11, a central portion 122 that has the center the same as that of a circle formed by the outer peripheral portion 121 and is formed in a disc shape having a surface area slightly larger than an area of the surface of the interposer 13, and a plurality of coupling portions 123 (four in FIG. 1) that extend from an outer peripheral direction of the central portion 122 to reach the outer peripheral portion 121 and couple the outer peripheral portion 121 and the central portion 122. Such a reinforcing member 12 is realized by a material of high hardness such as alumite-finished aluminum, stainless steel, invar material, Kovar material (registered trademark), or duralumin.

The interposer 13 has a regular octagonal surface and is formed in a thin plate shape. The interposer 13 may, for example, have a base material of a thin film shape made of an insulating material such as polyimide and a plurality of connection terminals of a leaf spring type disposed in a predetermined pattern on both sides of the base material and be formed in a cantilever shape. In this case, connection terminals provided on one surface of the interposer 13 come into contact with electrode pads of the space transformer 14 and connection terminals provided on the other surface come into contact with electrode pads of the substrate 11, whereby electrical connection of the space transformer 14 and the substrate 11 is realized. The connection terminals can also be configured by coil pins.

Pressure conductive rubber (a rubber connector) in which metal particles are arrayed in a thickness direction in silicon rubber of a thin plate shape can also be applied as the interposer 13 besides the one described above. When a pressure is applied in the thickness direction, the metal particles adjacent to one another in the silicon rubber come into contact with one another, whereby the pressure conductive rubber shows anisotropic conductivity. The electrical connection between the substrate 11 and the space transformer 14 can be realized by configuring the interposer 13 using the pressure conductive rubber having such a characteristic.

In the space transformer 14, as in the substrate 11, a wiring layer in the inside is three-dimensionally formed by via-holes and the like. The space transformer 14 has a regular octagonal surface substantially congruent with the interposer 13 and is formed in a thin plate shape. Such a space transformer 14 includes an insulating material such as ceramic as a base material and also plays a function of reducing a difference between the coefficient of thermal expansion of the probe head 15 and the coefficient of thermal expansion of the substrate 11.

The probe head 15 is formed in a disc shape and houses and holds the probes 2 in a probe housing area 15p shown in FIG. 2 such that the probes 2 project vertically on the paper surface in FIG. 2. The number and an arrangement pattern of the probes 2 housed in the probe head 15 are decided according to the number of semiconductor chips formed in the semiconductor wafer 100 and an arrangement pattern of the electrode pads 101. For example, when the semiconductor wafer 100 having a diameter of 8 inches (about 200 millimeters) is a test object, several hundreds to several thousands probes 2 are necessary. When the semiconductor wafer 100 having a diameter of 12 inches (about 300 millimeters) is a test object, several thousands to several ten thousands probes 2 are necessary.

The probe head 15 is formed by using an insulating material such as ceramic. Hole sections for housing the probes 2 are formed in a thickness direction thereof according to an array of the semiconductor wafer 100.

The holding member 16 is made of the same material as the reinforcing member 12 and has a hollow portion of a regular octagonal pole shape in which the interposer 13 and the space transformer 14 can be stacked and held. The holding member 16 presses and holds the interposer 13 and the space transformer 14 against the substrate 11 to thereby apply a pressure necessary for the substrate 11 and the space transformer 14 to be electrically connected via the interposer 13.

The leaf spring 17 is formed of a resilient material such as phosphor bronze, stainless steel (SUS), or beryllium copper and is formed in a thin annular shape. In an inner circumference of the leaf spring 17, the pawl portions 171 as pressing members for holding the interposer 13, the space transformer 14, and the probe head 15 are uniformly provided over the entire circumference. Such pawl portions 171 equally press the entire circumference near an edge of the surface of the probe head 15 in a direction of the substrate 11. Therefore, a substantially uniform initial load is generated in the probes 2 housed in the probe head 15. Even if deformation such as warp, waviness, and irregularity of the probe head 15 poses a problem, for example, when a large number of probes 2 are held as described above, such deformation can be controlled.

The substrate 11 and the reinforcing member 12, the substrate 11 and the holding member 16, and the holding member 16 and the leaf spring 17 are respectively fastened by screws inserted in predetermined positions (not shown).

One ends of the wires 18 formed in the substrate 11 are connected to a plurality of male connectors 19 disposed on a surface of the substrate 11, which is a surface on a side where the reinforcing member 12 is mounted, to be connected to a testing device (not shown). On the other hand, the other ends of the wires 18 are connected to the probes 2, which are housed and held in the probe head 15, via the electrode pads 141 formed at a lower end of the space transformer 14. In FIG. 3, for simplification of illustration, only a part of the wires 18 are schematically shown.

The respective male connectors 19 are disposed radially with respect to the center of the substrate 11 and form pairs with respective female connectors 20 provided in positions opposed thereto in the connector seat of the testing device. Terminals of the probes 2 and the testing device come into contact with each other to thereby establish electrical connection between the probes 2 and the testing device. As a connector including the male connectors 19 and the female connectors 20, it is possible to apply a zero insertion force (ZIF) type connector that requires little external force when male connectors are inserted and pulled and applies a press contact force to the connectors using an external force after the connectors are coupled. If the ZIF type connector is applied, the probe card 1 and the testing device are hardly subjected to stress due to connection even if the number of the probes 2 is large, sure electrical connection can be obtained, and durability of the probe card 1 can be improved.

The male connectors can be provided in the testing device and the female connectors can be provided in the probe card. The connectors may be arranged in a shape other than the radial shape. Instead of realizing the connection between the probe card and the testing device using the connectors, it is also possible that terminals such as POGO pins having a spring action are provided in the testing device and the probe card and the testing device are connected via such terminals.

As shown in FIG. 3, the probes 2 are housed and held in the probe head 15 such that the tips on one side project according to an arrangement pattern of electrode pads of the semiconductor wafer 100 placed on a wafer chuck 4. The tips (bottom surface sides) of the respective probes 2 come into contact with surfaces of a plurality of electrode pads 101 of the semiconductor wafer 100 from a vertical direction with a predetermined pressure. Such probes 2 are formed in a thin needle shape and resiliently urged to be elastic in a longitudinal direction thereof. As such probes 2, any one of the probes known in the past can be applied.

A positional relation between the probe card 1 and the semiconductor wafer 100 is explained. When a test of the semiconductor wafer 100 is performed, the test is performed under a plurality of different temperature environments. Therefore, if a temperature difference between a minimum (a lowest temperature) and a maximum (a highest temperature) of temperatures during the test is large, a difference in a degree of expansion due to a difference among coefficients of thermal expansion of respective members configuring the probe card 1 is conspicuous. Consequently, it is likely that the tips of the probes 2 do not come into contact with appropriate positions of the semiconductor wafer 100 and the space transformer 14 depending on temperature during the test. Therefore, in the first embodiment, when a test is performed under a temperature environment having an average temperature of a lowest temperature and a highest temperature during a test, both ends of the probes 2 are configured to come into contact with portions near the centers of the electrode pads of the semiconductor wafer 100 and the electrode pads of the space transformer 14.

In the first embodiment, depending on content or the like of a test, atmospheric temperature of a testing system including the probe card 1 and the wafer chuck 4 is changed in some cases and the temperature of the wafer chuck 4 is changed in other cases. Therefore, the temperature environment in this context means an environment corresponding to any one of the atmospheric temperature during a test and the temperature of the wafer chuck 4 or both. The same holds true throughout all embodiments of the present invention.

Figure 4A:
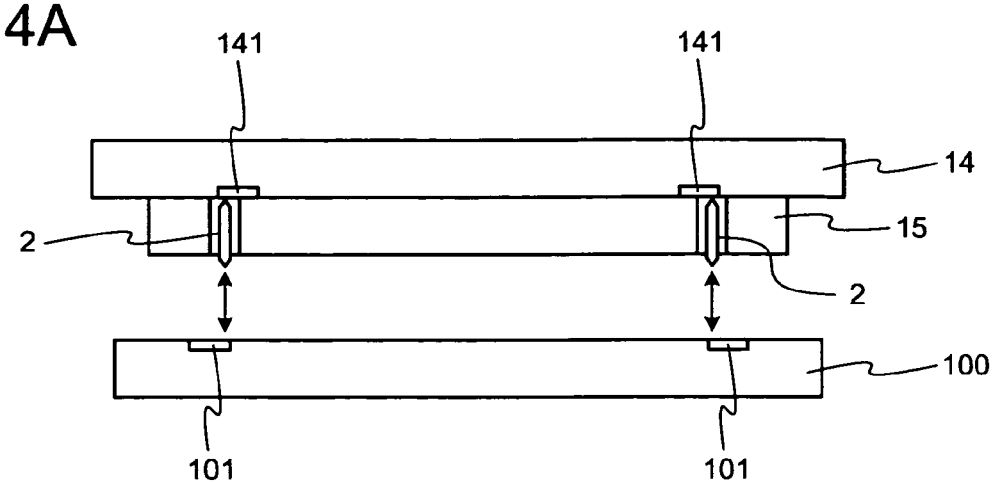
FIG. 4A is a diagram of the structure of a main part of the probe card under a lowest temperature environment.
Figure 4B:
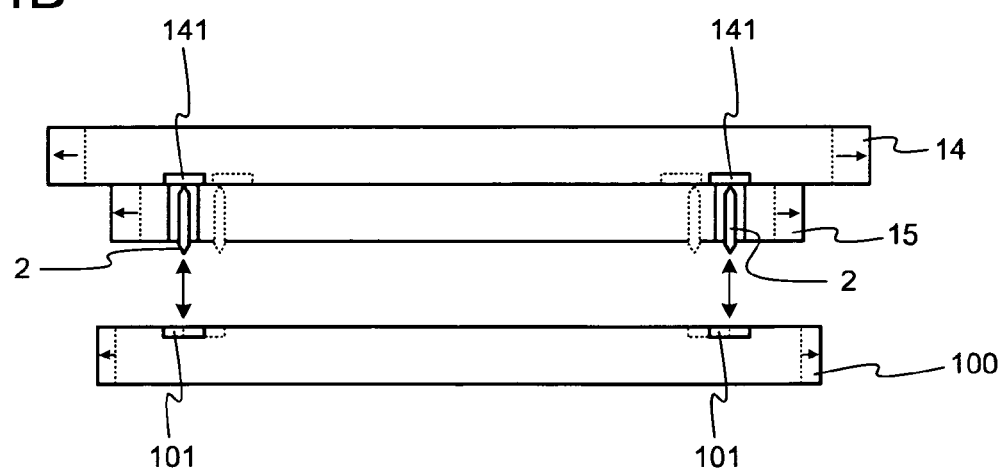
FIG. 4B is a diagram of the structure of the main part of the probe card under an average temperature environment.
Figure 4C:
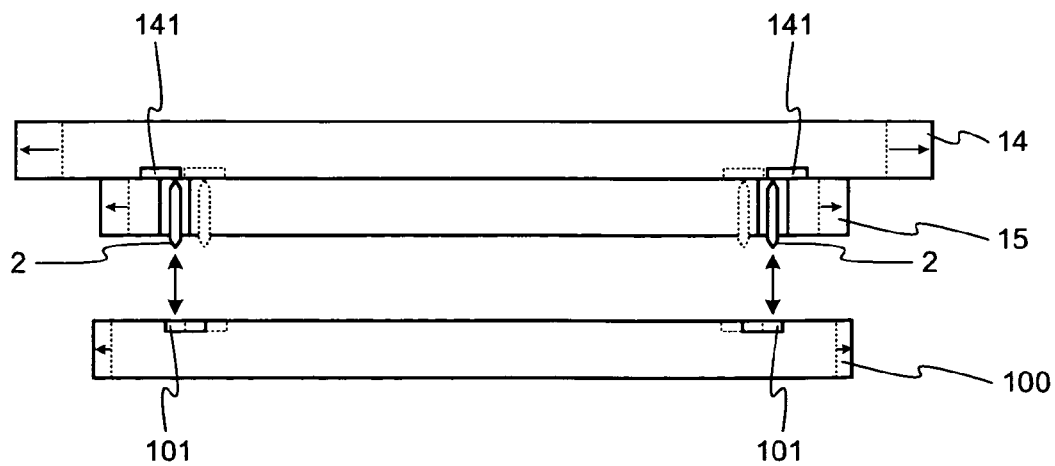
FIG. 4C is a diagram of the structure of the main part of the probe card under a highest temperature environment.

FIGS. 4A to 4C are schematic diagrams of positional relations among the space transformer 14, the probe head 15, and the semiconductor wafer 100 configuring the probe card 1 in temperature environments having different temperatures. In the following explanation, as in the section of the background art described above, a coefficient of thermal expansion of the space transformer 14 is represented as $C_S$, a coefficient of thermal expansion of the probe head 15 is represented as $C_P$, and a coefficient of thermal expansion of the semiconductor wafer 100 is represented as $C_W$. In FIGS. 4A to 4C, it is assumed that a relation $C_S > C_P > C_W$ holds among the three coefficients of thermal expansion.

In FIGS. 4A to 4C, it is the main object to explain the positional relations among the space transformer 14, the probe head 15, and the semiconductor wafer 100. Therefore, details of the other components are simplified and only two of the probes 2 are shown.

FIG. 4A is a schematic diagram of a positional relation among the space transformer 14, the probe head 15, and the semiconductor wafer 100 under a temperature environment having a lowest temperature $T_{low}$ during a test. Under this lowest temperature environment, upper ends of the probe 2 are in contact with portions near outer edges of the electrode pads 141 provided in the space transformer 14. Lower ends of the probes 2 are in contact with portions near inner edges of the electrode pads 101 provided in the semiconductor wafer 100.

FIG. 4B is a schematic diagram of a positional relation among the space transformer 14, the probe head 15, and the semiconductor wafer 100 under a temperature environment in which the temperature is raised from the lowest temperature $T_{low}$ to an average $T_{mean} = (T_{low} + T_{high})/2$ of the lowest temperature $T_{low}$ and a highest temperature $T_{high}$ during the test. Under this average temperature environment, the upper ends of the probes 2 are in contact with portions near the centers of the electrode pads 141 of the space transformer 14 and, on the other hand, the lower ends of the probes 2 are in contact with portions near the centers of the electrode pads 101 of the semiconductor wafer 100. Broken lines shown in FIG. 4B indicate the positional relation under the lowest temperature environment (FIG. 4A).

FIG. 4C is a schematic diagram of a positional relation among the space transformer 14, the probe head 15, and the semiconductor wafer 100 under a temperature environment in which the temperature is further raised from the average temperature $T_{mean}$ to the highest temperature $T_{high}$ during the test. In this highest temperature environment shown in FIG. 4C, the upper ends of the probes 2 are in contact with portions near inner edges of the electrode pads 141 of the space transformer 14. The lower ends of the probes 2 are in contact with portions near outer edges of the electrode pads 101 of the semiconductor wafer 100 during the test. Broken lines shown in FIG. 4C indicate the positional relation under the average temperature environment (FIG. 4B).

The positions where the tips of the probes 2 are in contact with the electrode pads 101 and the electrode pads 141 are different in this way because there is a difference among the three coefficients of thermal expansion $C_S$, $C_P$, and $C_W$. The space transformer 14 having a largest coefficient of thermal expansion among these three members most easily expands according to a rise in temperature. Therefore, the space transformer 14 expands in the horizontal direction at the largest rate in FIGS. 4B and 4C. On the other hand, the semiconductor wafer 100 having a smallest value of a coefficient of thermal expansion among the three members expands in the horizontal direction at a smallest rate in FIGS. 4B and 4C. Therefore, under the lowest temperature environment shown in FIG. 4A, the tips of the probes 2 and the electrode pads 101 and the 141 are in contact with each other with tip positions of the probes 2 and positions of the centers of the electrode pads 101 and 141 shifted from each other. On the other hand, under the average temperature environment shown in FIG. 4B, the tips of the probes 2 are in contact with the centers of the electrode pads 101 and 141. Thermal expansion in the vertical direction can be neglected because the thicknesses in the vertical direction of these three members are conspicuously small compared with the widths in the horizontal direction of the members.

Figure 18:
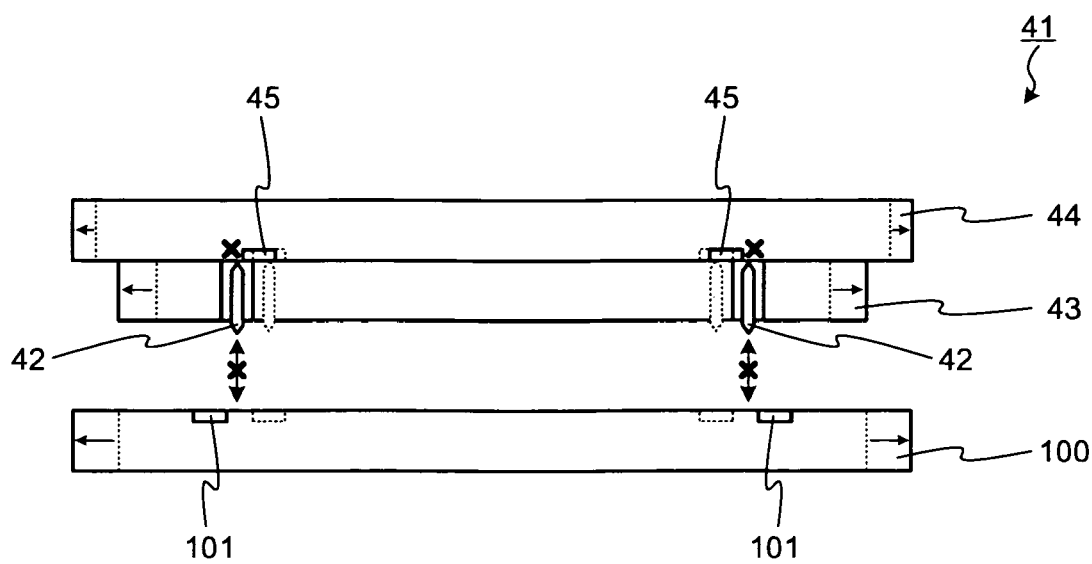
FIG. 18 is a schematic diagram of the structure under a high temperature environment of the main part of the probe card in the past.

In the probe card in the past, positioning of the probes and the electrode pads is performed under the room temperature environment (which may coincide with the lowest temperature environment). However, in this case, an amount of shift between the probes and the electrode pads is large under a high temperature environment and the probes and the electrode pads do not come into contact with each other in some cases (see FIG. 18). On the other hand, in the first embodiment, positioning is performed to bring the tips of the probes 2 into contact with the centers of the electrode pads 101 and 141 under the average temperature environment. Therefore, an amount of shift of contact positions in a temperature band assumed during a test can be reduced to about ½ of that in the past. As a result, it is possible to surely bring the electrode pads 101 of the semiconductor wafer 100 and the electrode pads 141 of the space transformer 14 and the tips of the probes 2 into contact with each other regardless of a temperature environment.

Figure 5:
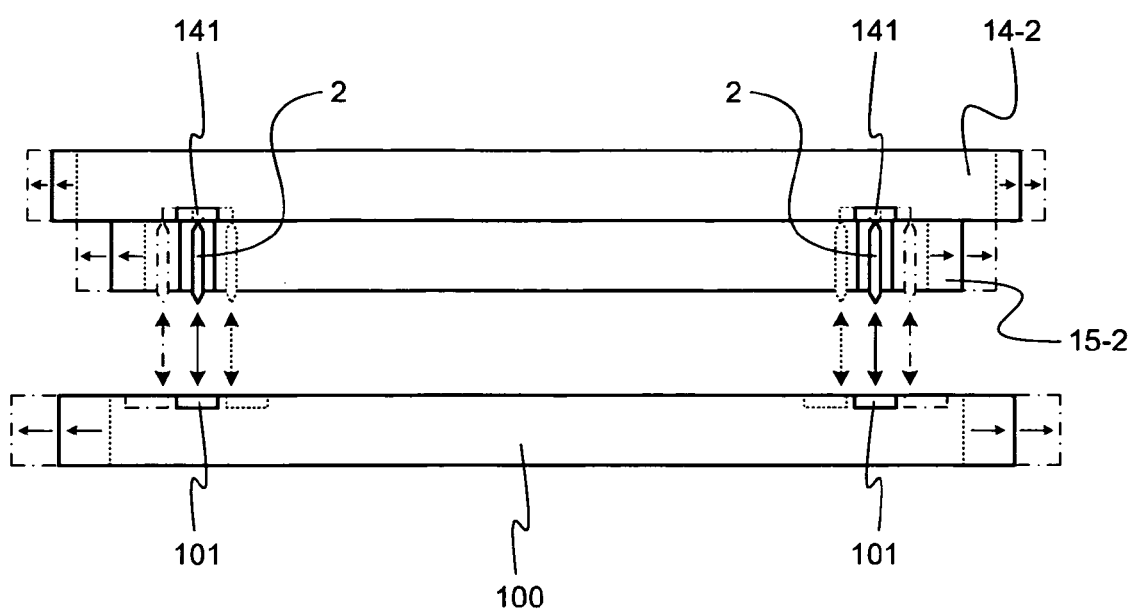
FIG. 5 is a diagram of the structure of a main part of a probe card according to a modification of the first embodiment of the present invention.

A relation among the three coefficients of thermal expansion $C_S$, $C_P$, and $C_W$ is not limited to the case described above. FIG. 5 is a diagram of a positional relation among a space transformer, a probe head, and a semiconductor wafer under the average temperature environment at the time when there is a relation $C_S < C_P < C_W$ among the three coefficients of thermal expansion $C_S$, $C_P$, and $C_W$. In the case shown in the figure, as in the case described above, the tips of the probes 2 are in contact with portions near the centers of the electrode pads 101 and 141 under the average temperature environment. In FIG. 5, a positional relation among the space transformer, the probe head, and the semiconductor wafer under the lowest temperature environment is indicated by broken lines and a positional relation among the members under the highest temperature environment is indicated by alternate long and short dash lines.

In the case shown in FIG. 5, a degree of thermal expansion of the semiconductor wafer 100 is the largest and a degree of thermal expansion of a space transformer 14-2 is the smallest. Therefore, contact positions during a test by the probes 2 housed and held in a probe head 15-2 with the electrode pads 101 change from an outer edge side to an inner edge side as the temperature rises. On the other hand, contact positions of the probes 2 with the electrode pads 141 change from the inner edge side to the outer edge side as the temperature rises.

In general, it is known that the coefficient of thermal expansion $C_W$ of the semiconductor wafer 100 containing silicon as a main component is about 3.4 (ppm/° C.). However, in the first embodiment, because a positional relation at an average of temperatures used in a test only has to be set as a reference, optimum materials can be selected as materials of the space transformer 14 and the probe head 15 regardless of coefficients of thermal expansion thereof. Therefore, a degree of freedom of material selection in manufacturing the probe card 1 remarkably increases.

With the probe card according to the first embodiment of the present invention explained above, the probe card includes a plurality of probes that are made of a conductive material and come into contact with electrode pads of a semiconductor wafer to input or output an electric signal, a probe head that houses and holds the probes, a substrate that has a wiring pattern corresponding to a circuitry, and a space transformer that is stacked on the probe head, changes a space of the wiring pattern of the substrate and relays wires, and has electrode pads provided on a surface on a side opposed to the probe head in association with the relayed wires. Both ends of the probes come into contact with portions near the centers of the electrode pads of the semiconductor wafer and the space transformer under an environment having an average temperature of a lowest temperature and a highest temperature in testing the semiconductor wafer. Consequently, it is possible to surely bring the probes into contact with a contact object regardless of a temperature environment during a test.

According to the first embodiment, positioning of the probes and the electrode pads is performed by using, as a reference, a positional relation among the probe head, the spate transformer, and the semiconductor wafer in the middle of a temperature width during a test, i.e., under the temperature environment having the average temperature of the lowest temperature and the highest temperature during the test. Therefore, in a temperature band assumed during the test, the probes do not fail to come into contact with the electrode pads of the semiconductor wafer and the space transformer. Therefore, a degree of freedom of material selection for the probe head and the space transformer increases. As a result, it is possible to flexibly respond to demands of customers and realize a reduction in cost.

Moreover, according to the first embodiment, it is possible to flexibly cope with sizes of the electrode pads of the semiconductor wafer and the space transformer. For example, it is easy to bring the probes into contact with electrode pads having a size equal to or smaller than a 0.2 mm pitch.

Second Embodiment

A probe card according to a second embodiment of the present invention includes a pair of positioning pins that perform positioning of a probe head and a space transformer. One of positioning holes, through which the pair of positioning pins are inserted, is formed in a long hole shape, the length of which in a longitudinal direction is set larger than a diameter of the positioning pins.

In the second embodiment, it is assumed that positioning between electrode pads of the space transformer and a semiconductor wafer and probes is performed in the same manner as the first embodiment. In other words, it is assumed that the positioning is performed by using, as a reference, a positional relation among the space transformer, the probe head, and the semiconductor wafer under a temperature environment having an average temperature of a lowest temperature and a highest temperature during a test.

Figure 6:
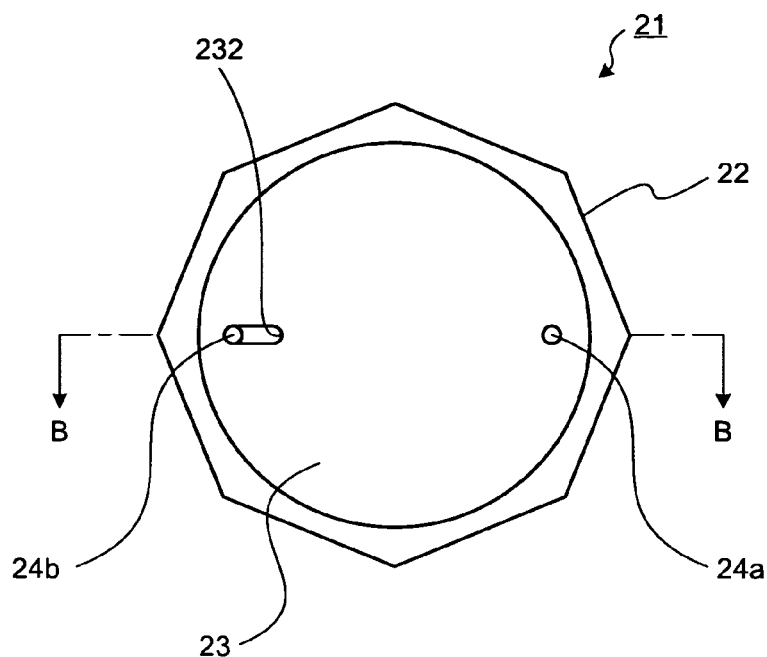
FIG. 6 is a diagram of the structure under a lowest temperature environment of a main part of a probe card according to a second embodiment of the present invention.
Figure 7:
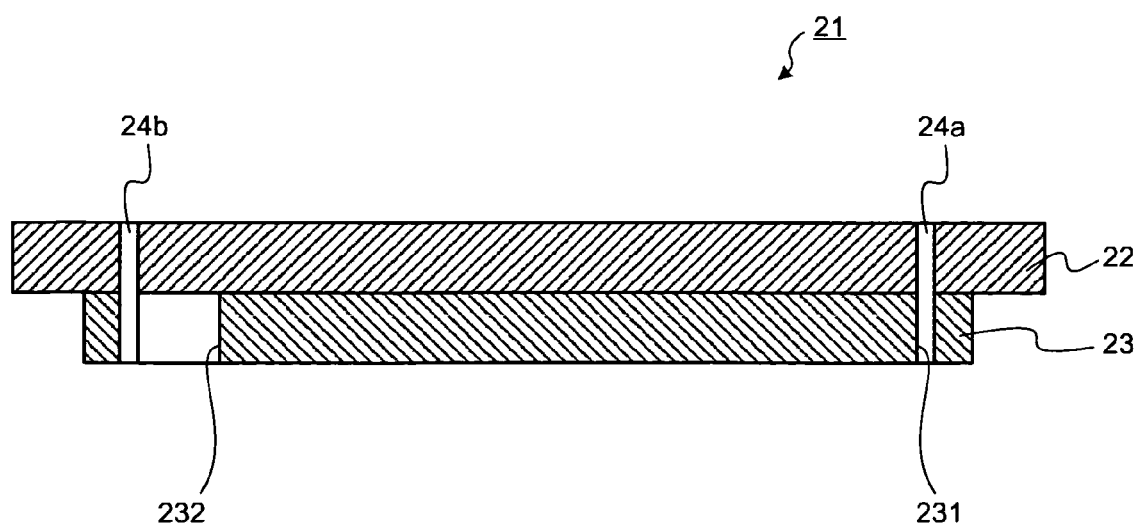
FIG. 7 is a schematic diagram of a section taken along line B-B in FIG. 6.

FIG. 6 is a diagram of the structure of the probe head and the space transformer of the probe card according to the second embodiment. FIG. 7 is a schematic diagram of a section taken along line B-B in FIG. 6. In the following explanation, it is assumed that there is a relation $C_S < C_P$ between a coefficient of thermal expansion $C_S$ of the space transformer and a coefficient of thermal expansion $C_P$ of the probe head. It is assumed that, in FIGS. 6 and 7, a positional relation between the space transformer and the probe head under a lowest temperature environment during a test is shown. In FIG. 7, wires in the inside of the probe card including the probes are not shown. The same holds true concerning the same section referred to below.

A probe card 21 shown in FIGS. 6 and 7 includes a space transformer 22, a probe head 23, and two positioning pins 24a and 24b fastened to extend out in a direction orthogonal to a surface of the space transformer 22. The positioning pins 24a and 24b are fastened near both ends of a diagonal line that passes the center of the surface of the space transformer 22. In the probe head 23, a pair of positioning holes 231 and 232, through which the positioning pins 24a and 24b having the same shape are inserted, respectively, to perform positioning of the probe head 23 with respect to the space transformer 22, are formed near both ends on a diagonal line that passes the center of a surface of the probe head 23.

The positioning hole 231 of the two positioning holes has a diameter substantially same as that of the positioning pin 24a and the like and a position thereof with respect to the probe head 23 is substantially fixed. On the other hand, the length of the positioning hole 232 in an outer circumferential direction of a circle formed by the surface of the probe head 23 is larger than the diameter of the positioning pin 24 and the like. Therefore, the positioning pin 24b inserted through the positioning hole 232 has a degree of freedom of moving along the outer circumferential direction of the circle with respect to the probe head 23.

Components except those described above of the probe card 21 are the same as those of the probe card 1 described above.

Figure 8:
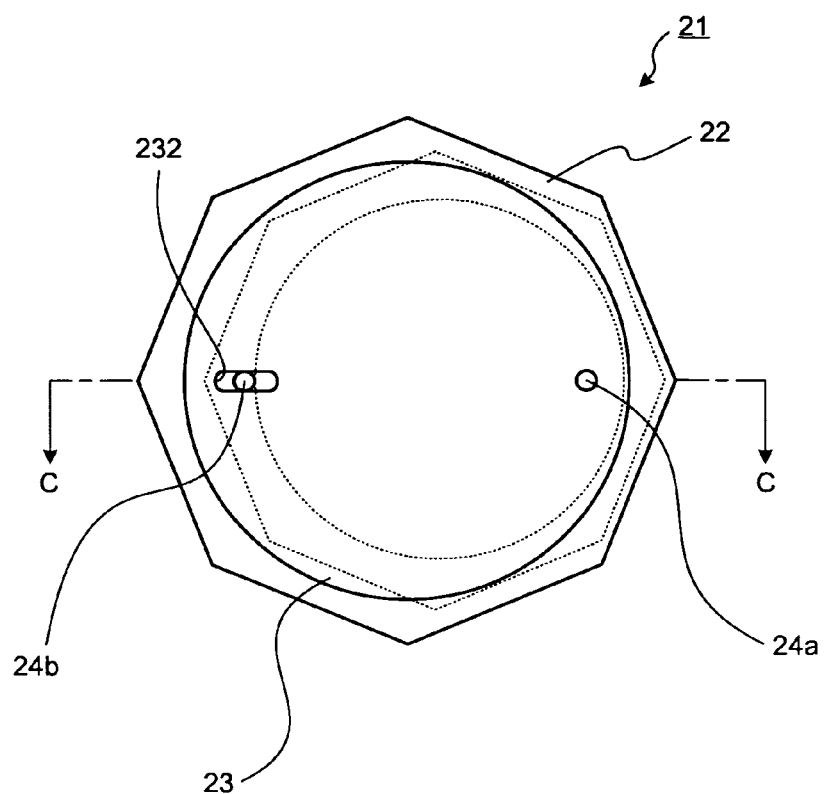
FIG. 8 is a diagram of the structure under an average temperature environment of the main part of the probe card according to the second embodiment of the present invention.
Figure 9:
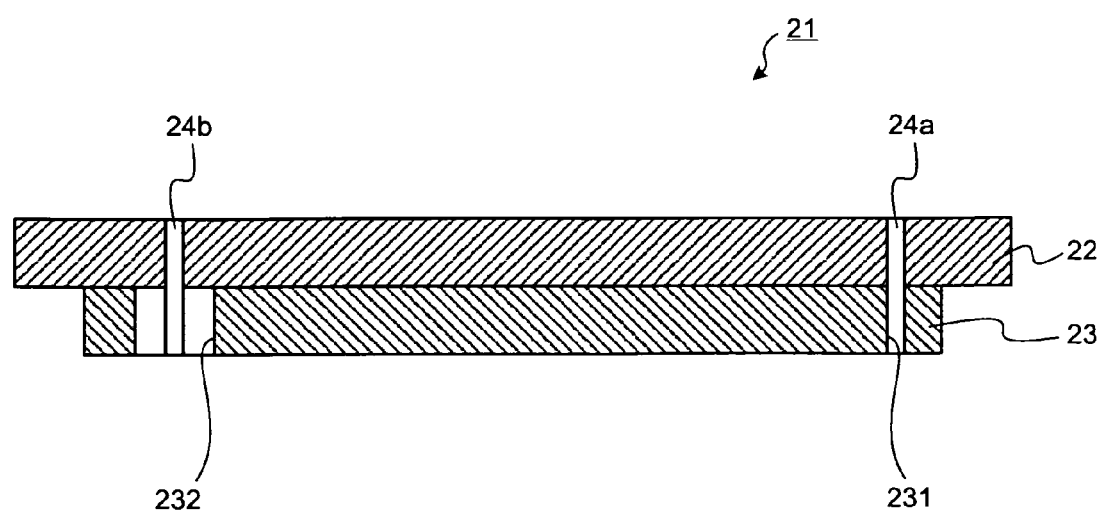
FIG. 9 is a schematic diagram of a section taken along line C-C in FIG. 8.

FIG. 8 is a diagram of a positional relation between the space transformer 22 and the probe head 23 under an average temperature environment of the probe card 21. FIG. 9 is a schematic diagram of a section taken along line C-C in FIG. 8. Broken lines in FIG. 8 indicate a positional relation between the space transformer 22 and the probe head 23 in a state shown in FIG. 6, i.e., under the lowest temperature environment during a test. In FIGS. 8 and 9, because a degree of thermal expansion is larger in the probe head 23, the positioning pin 24b is located near the center of the positioning hole 232.

Figure 10:
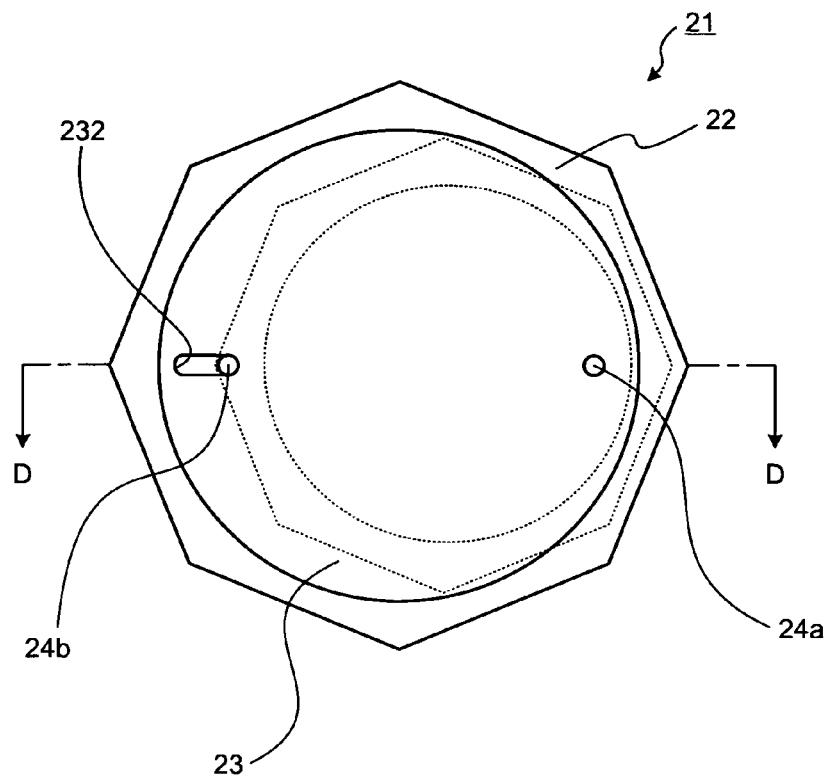
FIG. 10 is a diagram of the structure under a highest temperature environment of the main part of the probe card according to the second embodiment of the present invention.
Figure 11:
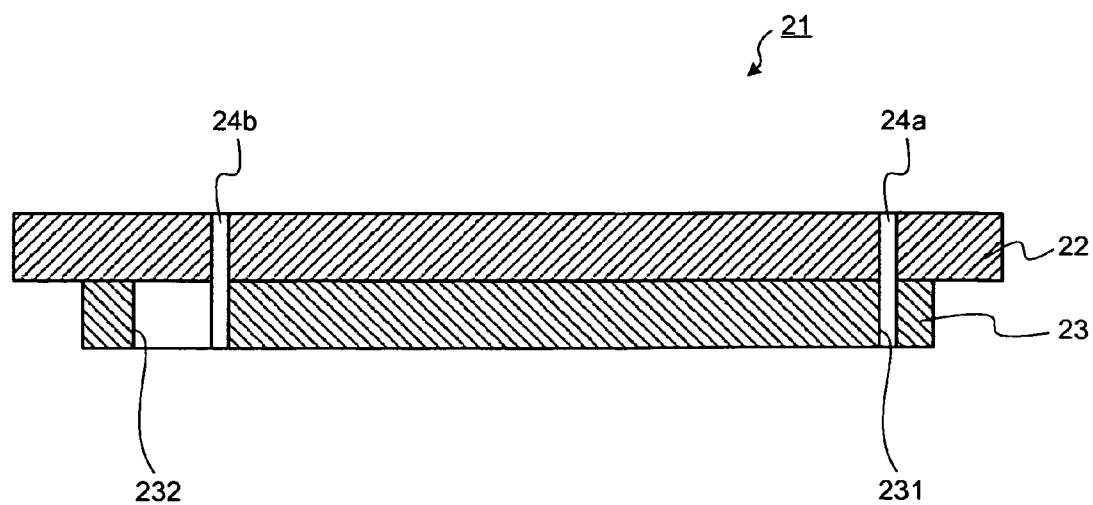
FIG. 11 is a schematic diagram of a section taken along line D-D in FIG. 10.

FIG. 10 is a diagram of a positional relation between the space transformer 22 and the probe head 23 under a highest temperature environment during a test by the probe card 21. FIG. 11 is a schematic diagram of a section taken along line D-D in FIG. 10. Broken lines in FIG. 10 indicate a positional relation between the space transformer 22 and the probe head 23 under the state shown in FIG. 6, i.e., under the lowest temperature environment during a test. In a state shown in FIGS. 10 and 11, the positioning pin 24b is located near an inner edge of the positioning hole 232.

The positioning hole 232 formed in a long hole shape is provided in the probe head 23 in this way. Consequently, it is possible to change a positional relation between the space transformer 22 and the probe head 23 according to temperature and reduce and absorb a difference between the coefficient of thermal expansion $C_S$ of the space transformer 22 and the coefficient of thermal expansion $C_P$ of the probe head 23. As a result, unlike a probe card in which all positioning pins are inserted through positioning holes having a diameter substantially same as that of the positioning pins in the same manner as the positioning pin 24a, the probe card 21 is prevented from being broken by cracks or the like caused in places where the positioning pins are inserted of the probe head expanded by a rise in temperature.

Figure 12:
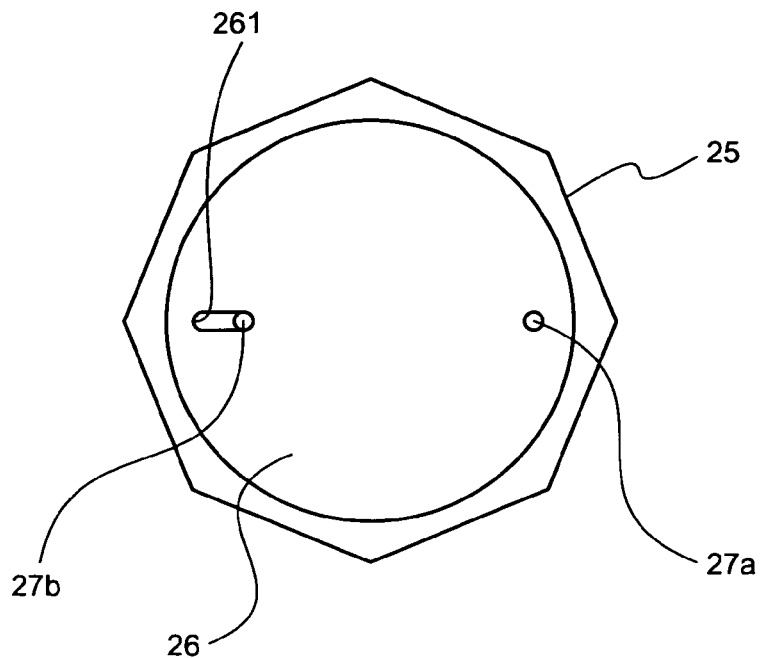
FIG. 12 is a diagram of the structure of a main part of a probe card according to a modification of the second embodiment of the present invention.

In the second embodiment, as in the first embodiment, it is also assumed that a relation $C_S > C_P$ holds between the coefficient of thermal expansion $C_S$ of the space transformer and the coefficient of thermal expansion $C_P$ of the probe head. FIG. 12 is a diagram of a positional relation between the space transformer and the probe head under the low temperature environment during a test in this case. In the case shown in the figure, a space transformer 25 and a probe head 26 are positioned by two positioning pins 27a and 27b. The positioning pin 27b is inserted through a positioning hole 261 formed in a long hole shape, a longitudinal direction of which is parallel to a radial direction of a surface of the probe head 26. In FIG. 12, the positioning pin 27b is located on an inner edge side of the positioning hole 261. An inserting position of the positioning pin 27b changes to an outer edge side of the positioning hole 261 as temperature rises.

With the probe card according to the second embodiment of the present invention explained above, the probe card includes a plurality of probes that are made of a conductive material and come into contact with electrode pads of a semiconductor wafer to input or output an electric signal, a probe head that houses and holds the probes, a substrate that has a wiring pattern corresponding to a circuitry, and a space transformer that is stacked on the probe head, transforms a space of the wiring pattern of the substrate and relays wires, and has electrode pads provided on a surface on a side opposed to the probe head in association with the relayed wires. Both ends of the probes come into contact with portions near the centers of the electrodes pads of the semiconductor wafer and the space transformer under an environment having an average temperature of a lowest temperature and a highest temperature in testing the semiconductor wafer. Consequently, as in the first embodiment, it is possible to surely bring the probes into contact with a contact object regardless of a temperature environment during a test.

According to the second embodiment, the probe card further includes a pair of positioning pins that are fastened to the space transformer and perform positioning of the space transformer and the probe head. The length in an outer peripheral direction of at least one of positioning holes, through which the pair of positioning pins are inserted, is set larger than a diameter of the positioning pins. Consequently, even when there is a difference between a coefficient of thermal expansion of the probe head and a coefficient of thermal expansion of the space transformer, the probe head and the space transformer do not break in a test of a semiconductor wafer when temperature is high.

Third Embodiment

A probe card according to a third embodiment of the present invention includes, as in the second embodiment, positioning pins that perform positioning of a probe head and a space transformer. In the third embodiment, a plurality of positioning pins are inserted in positions symmetrical with respect to the center of a surface of a probe head formed in a center-symmetrical shape. Positioning holes, through which the respective positioning pins are inserted, are formed in a long hole shape, the length of which in a radial direction of the probe head surface is set larger than a diameter of the positioning pins.

In the third embodiment, it is assumed that positioning between electrode pads of the space transformer and a semiconductor wafer and probes is performed in the same manner as the first embodiment. In other words, it is assumed that the positioning is performed by using, as a reference, a positional relation among the space transformer, the probe head, and the semiconductor wafer under a temperature environment having an average temperature of a lowest temperature and a highest temperature during a test.

Figure 13:
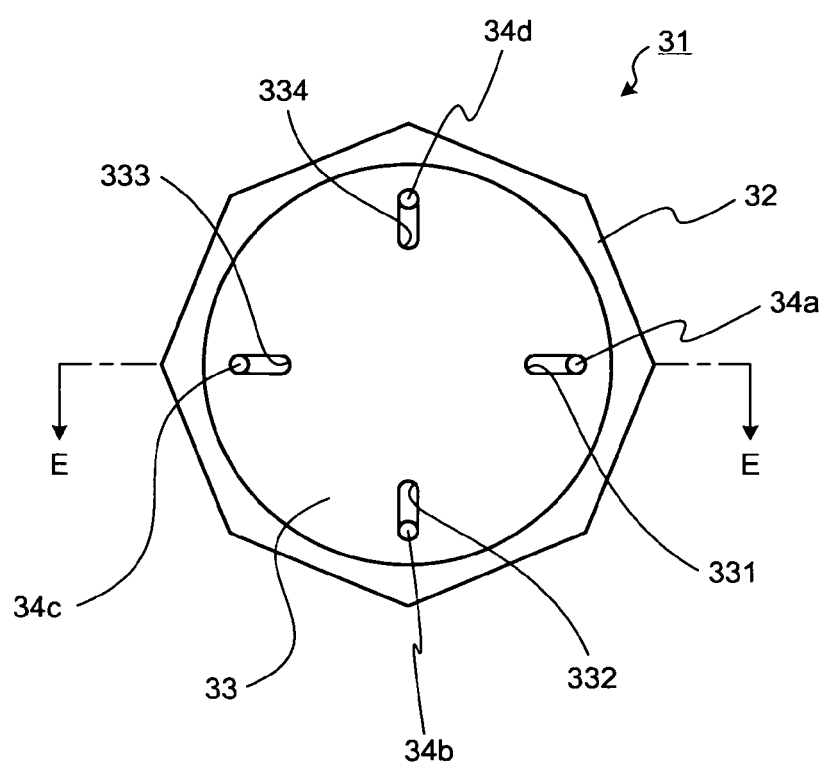
FIG. 13 is a diagram of the structure under a lowest temperature environment of a main part of a probe card according to a third embodiment of the present invention.
Figure 14:
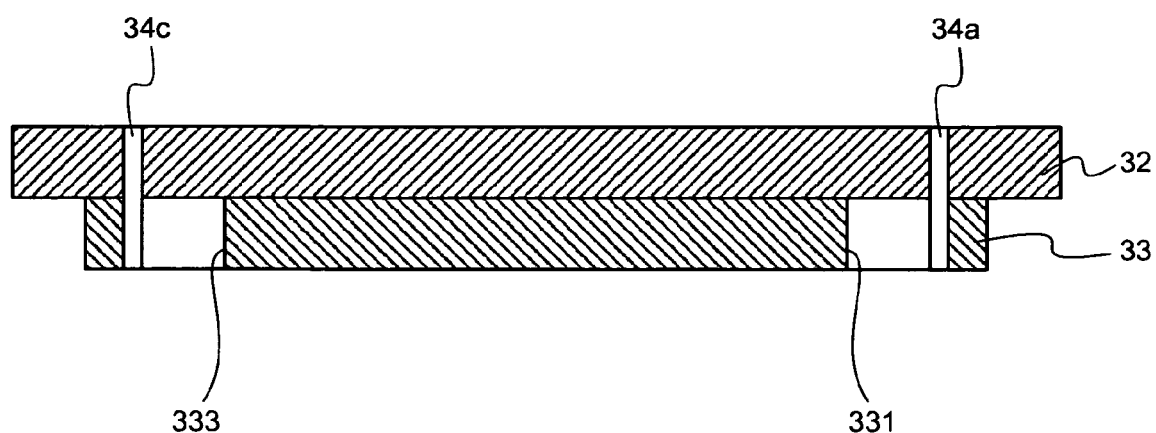
FIG. 14 is a schematic diagram of a section taken along line E-E in FIG. 13.

FIG. 13 is a diagram of the structure of the probe head and the space transformer of the probe card according to the third embodiment. FIG. 14 is a schematic diagram of a section taken along line E-E in FIG. 13. In the following explanation, it is assumed that there is a relation $C_S < C_P$ between a coefficient of thermal expansion $C_S$ of the space transformer and a coefficient of thermal expansion $C_P$ of the probe head. It is assumed that, in FIGS. 13 and 14, a positional relation between the space transformer and the probe head under a lowest temperature environment during a test is shown.

A probe card 31 shown in FIGS. 13 and 14 includes a space transformer 32, a probe head 33, and four positioning pins 34a, 34b, 34c, and 34d fastened to extend out in a direction orthogonal to a surface of the space transformer 32. The positioning pins 34a to 34d are fastened in positions symmetrical with respect to the center of the surface of the space transformer 32. In the probe head 33, positioning holes 331 to 334, through which the positioning pins 34a to 34d are inserted, respectively, to perform positioning of the probe head 33 with respect to the space transformer 32, are formed in positions symmetrical with respect to the center of a circle on a surface of the probe head 33.

The length of the positioning holes 331 to 334 in a radial direction radially widening from the center of the circle formed by the surface of the probe head 33 is set larger than a diameter of the positioning pin 34a and the like. Therefore, the positioning pins 34a to 34d inserted through the positioning holes 331 to 334, respectively, have a degree of freedom of moving along a radial direction of the circle with respect to the probe head 33. In other words, in the third embodiment, the probe head 33 expands radially widening from the center of the circle on the surface thereof.

Components except those described above of the probe card 31 are the same as those of the probe card 1 described above.

Figure 15:
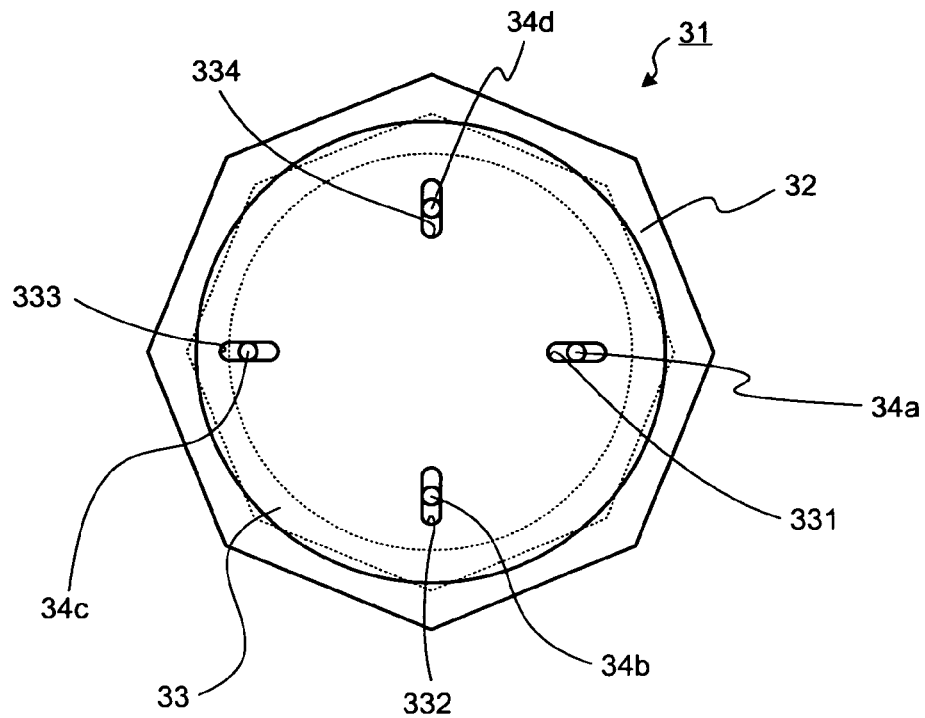
FIG. 15 is a diagram of the structure under an average temperature environment of the main part of the probe card according to the third embodiment of the present invention.

FIG. 15 is a diagram of a positional relation between the space transformer 32 and the probe head 33 under an average temperature environment during a test by the probe card 31. Broken lines in FIG. 15 indicate a positional relation between the space transformer 32 and the probe head 33 in a state shown in FIG. 13, i.e., under the lowest temperature environment during a test. In the third embodiment, because a degree of thermal expansion is larger in the probe head 33, the positioning pins 34a to 34d are located near the centers of the positioning holes 331 to 334 under the average temperature environment.

Figure 16:
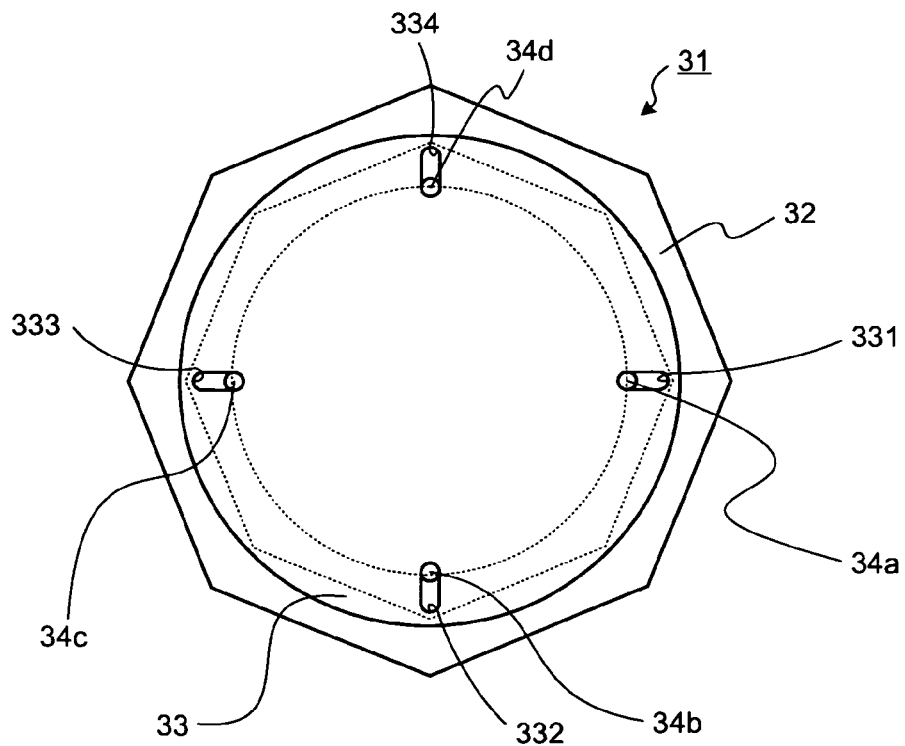
FIG. 16 is a diagram of the structure under a highest temperature environment of the main part of the probe card according to the third embodiment of the present invention.
Figure 17:
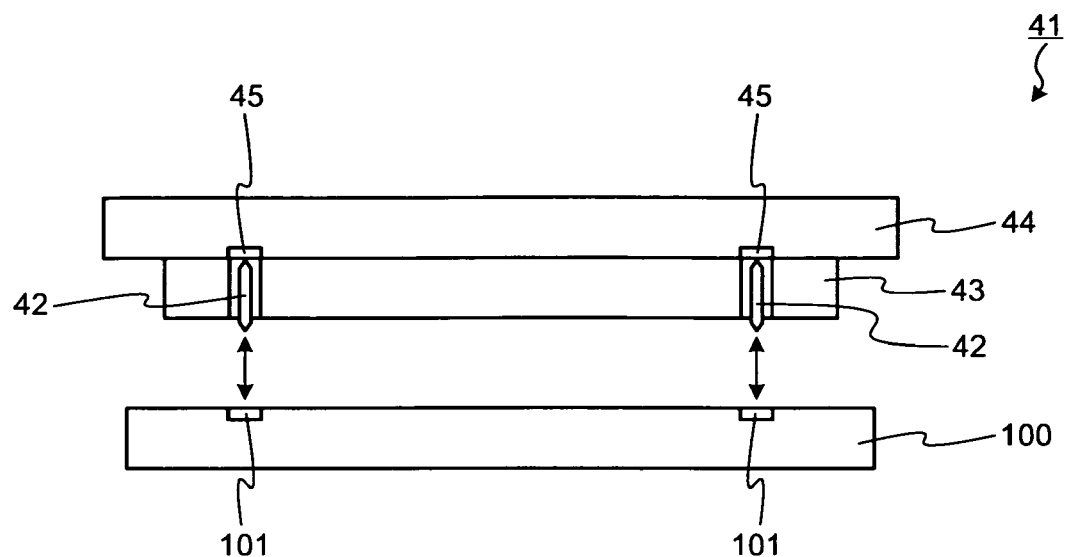
FIG. 17 is a schematic diagram of the structure of a main part of a probe card in the past.

FIG. 16 is a diagram of a positional relation between the space transformer 32 and the probe head 33 under a highest temperature environment during a test by the probe card 31. Broken lines in FIG. 16 also indicate a positional relation between the space transformer 32 and the probe head 33 in the state shown in FIG. 13, i.e., under the lowest temperature environment during a test. In a state shown in FIG. 16, the positioning pins 34a to 34d are located near respective edges of the positioning holes 331 to 334.

The positioning holes 331 to 334 formed in a long hole shape, a radial direction of which is a longitudinal direction, are provided on the surface of the probe head 33 in this way. Consequently, it is possible to change a positional relation between the space transformer 32 and the probe head 33 according to temperature and reduce and absorb a difference between the coefficient of thermal expansion $C_S$ of the space transformer 32 and the coefficient of thermal expansion $C_P$ of the probe head 33. As a result, as in the second embodiment, the probe card 31 is prevented from being broken by cracks or the like caused in places where the positioning pins are inserted of the probe head expanded by a rise in temperature.

It is also assumed that there is a relation $C_S > C_P$ between the coefficient of thermal expansion $C_S$ of the space transformer and the coefficient of thermal expansion $C_P$ of the probe head. In this case, in the same manner as the positioning hole 261 in FIG. 12 explained in the second embodiment, positioning only has to be performed to locate the positioning pins at the inner edges of the positioning holes under the lowest temperature environment.

With the probe card according to the third embodiment of the present invention explained above, the probe card includes a plurality of probes that are made of a conductive material and come into contact with electrode pads of a semiconductor wafer to input or output an electric signal, a probe head that houses and holds the probes, a substrate that has a wiring pattern corresponding to a circuitry, and a space transformer that is stacked on the probe head, transforms a space of the wiring pattern of the substrate and relays wires, and has electrode pads provided on a surface on a side opposed to the probe head in association with the relayed wires. Both ends of the probes come into contact with portions near the centers of the electrodes pads of the semiconductor wafer and the space transformer under an environment having an average temperature of a lowest temperature and a highest temperature in testing the semiconductor wafer. Consequently, as in the first embodiment, it is possible to surely bring the probes into contact with a contact object regardless of a temperature environment during a test.

According to the third embodiment, the probe card further includes a plurality of positioning pins that are fastened to the space transformer and perform positioning of the space transformer and the probe head. The length of positioning holes, through which the respective positioning pins are inserted, in a radial direction radially widening from the center of a surface of the probe head is set larger than a diameter of the positioning pins. Consequently, as in the second embodiment, even when there is a difference between a coefficient of thermal expansion of the probe head and a coefficient of thermal expansion of the space transformer, the probe head and the space transformer do not break in a test of a semiconductor wafer when temperature is high.

In particular, according to the third embodiment, all the positioning holes are formed in a long hole shape, a direction of which radially widening with respect to the center of the surface of the probe head is a longitudinal direction. Consequently, because the probe head radially expands with respect to the center of the surface, it is hardly likely that an excessive load is applied to a specific part of the probe head.

In the above explanation, the four positioning pins and the four positioning holes are provided. However, the number of positioning pins and positioning holes is not limited to this. The number can be three or five or more.

Other Embodiments

The first and second embodiments are described above as the best modes for carrying out the present invention; however, the present invention is not to be restricted to them. For example, the probe card according to the present invention can include a probe head formed in a polygonal surface shape as a shape other than a disk shape. The shapes can be changed according to a shape of a test object or a wiring pattern of the electrode pads.

Respective surface shapes of the interposer and the space transformer can be a circular shape similar to the probe head. In this case, the probe card for the FWLT has highest symmetry. Therefore, this is optimum when flatness and parallelism of the probe card is given a top priority.

Besides, the respective surfaces of the interposer and the space transformer can be formed in an appropriate regular polygonal shape and the probe head can be formed in a regular polygonal shape similar to the regular polygonal shape. A cut shape of the holding member is also changed according to a change in shapes of the interposer and the space transformer. When the probe head comes into full contact with the semiconductor wafer, the probe head can be circular. In this way, the probe card according to the present invention can include the substrate and the probe head formed in shapes other than a disc shape. The shapes can be changed according to a shape of a test object and an arrangement pattern of electrode pads provided in the test object.

It is obvious from the above description that the invention in its broader aspects is not limited to the specific details and representative embodiments shown and described herein. Accordingly, various modifications may be made without departing from the spirit or scope of the general inventive concept as defined by the appended claims and their equivalents.

INDUSTRIAL APPLICABILITY

As described above, the probe card according to the present invention is useful for an electric characteristic test for a semiconductor wafer and is particularly suitable for the FWLT.

The invention claimed is:

1. A probe card that electrically connects a semiconductor wafer to be tested and a circuitry for generating a signal for a test, the probe card comprising:
   a plurality of probes that are made of a conductive material and come into contact with electrode pads of a semiconductor wafer to input or output an electric signal;
   a probe head that houses and holds the probes;
   a substrate that has a wiring pattern corresponding to the circuitry; and
   a space transformer that is stacked on the probe head, changes a space of the wiring pattern of the substrate and thus relays wires, and has electrode pads provided on a surface on a side opposed to the probe head in association with the relayed wires, wherein
   both ends of the probes come into contact with portions near the centers of the electrodes pads of the semiconductor wafer and the space transformer under an environment having an average temperature of a lowest temperature and a highest temperature in testing the semiconductor wafer.

2. The probe card according to claim 1, further comprising a plurality of positioning pins that are fastened to the space transformer and perform positioning of the space transformer and the probe head, wherein
   the probe head has a plurality of positioning holes, through which the positioning pins are inserted, and at least one of the positioning holes is formed in a long hole shape, length in a longitudinal direction of which is larger than a diameter of the positioning pins.

3. The probe card according to claim 2, wherein
   a surface of the probe head is formed in a center-symmetrical shape, a pair of positioning pins are inserted near both ends of a diagonal line that passes a center of the surface, and length in a direction parallel to the diagonal line of a positioning hole, through which one of the pair of positioning pins is inserted, is larger than the diameter of the positioning pins.

4. The probe card according to claim 2, wherein a surface of the probe head is formed in a center-symmetrical shape, a plurality of positioning pins are inserted in positions symmetrical with respect to a center of the surface, and length in a radial direction radially widening from the center of the surface of positioning holes, through which the respective positioning pins are inserted, is larger than the diameter of the positioning pins.

5. The probe card according to claim 1, further comprising:
   a reinforcing member that is mounted on the substrate and reinforces the substrate;
   an interposer that is made of a conductive material and interposed between the substrate and the space transformer to relay wires of the substrate;
   a holding member that is fastened to the substrate and applies a pressure to and holds the interposer and the space transformer; and
   a leaf spring that is fastened to the holding member and presses an entire circumference near an edge of a surface of the probe head, which is a surface on which the probes project, in a direction of the substrate.

6. A probe card that electrically connects a semiconductor wafer to be tested and a circuitry for generating a signal for a test, the probe card comprising:
   a plurality of probes that are made of a conductive material and come into contact with electrode pads of a semiconductor wafer to input or output an electric signal;
   a probe head that houses and holds the probes;
   a substrate that has a wiring pattern corresponding to the circuitry;
   a space transformer that is stacked on the probe head, changes a space of the wiring pattern of the substrate and relays wires, and has electrode pads provided on a surface on a side opposed to the probe head in association with the relayed wires; and a plurality of positioning pins that are fastened to the space transformer and perform positioning of the space transformer and the probe head, wherein the probe head has a plurality of positioning holes, through which the positioning pins are inserted, respectively, and at least one of the positioning holes is formed in a long hole shape, length in a longitudinal direction of which is larger than a diameter of the positioning pins.

7. The probe card according to claim 6, wherein a surface of the probe head is formed in a center-symmetrical shape, a pair of positioning pins are inserted near both ends of a diagonal line that passes a center of the surface, and length in a direction parallel to the diagonal line of a positioning hole, through which one of the pair of positioning pins is inserted, is larger than the diameter of the positioning pins.

8. The probe card according to claim 6, wherein a surface of the probe head is formed in a center-symmetrical shape, a plurality of positioning pins are inserted in positions symmetrical with respect to a center of the surface, and length in a radial direction radially widening from the center of the surface of positioning holes, through which the respective positioning pins are inserted, is larger than the diameter of the positioning pins.

9. The probe card according to claim 6, further comprising:

a reinforcing member that is mounted on the substrate and reinforces the substrate;

an interposer that is made of a conductive material and interposed between the substrate and the space transformer to relay wires of the substrate;

a holding member that is fastened to the substrate and applies a pressure to and holds the interposer and the space transformer; and a leaf spring that is fastened to the holding member and presses an entire circumference near an edge of a surface of the probe head, which is a surface on which the probes project, in a direction of the substrate.

* * * * *